(12) United States Patent
Richards

(10) Patent No.: US 7,196,684 B2
(45) Date of Patent: *Mar. 27, 2007

(54) SPATIAL LIGHT MODULATOR WITH CHARGE-PUMP PIXEL CELL

(75) Inventor: Peter W. Richards, Palo Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/349,517

(22) Filed: Feb. 6, 2006

(65) Prior Publication Data

US 2006/0125753 A1 Jun. 15, 2006

Related U.S. Application Data

(63) Continuation of application No. 10/340,162, filed on Jan. 10, 2003, now Pat. No. 7,012,592.

(51) Int. Cl.
 *G09G 3/36* (2006.01)
(52) U.S. Cl. ............... 345/92; 349/42; 365/185.08
(58) Field of Classification Search ............. 345/92, 345/90, 84; 438/242; 257/E27.098, E27.084, 257/E21.661; 365/104, 185.08; 327/537, 327/536; 359/248; 349/42
 See application file for complete search history.

(56) References Cited

U.S. PATENT DOCUMENTS

| | | | |
|---|---|---|---|
| 4,638,309 A | 1/1987 | Ott | |
| 5,019,702 A | 5/1991 | Ohzu et al. | |
| 5,671,083 A | 9/1997 | Conner et al. | |
| 5,862,076 A | 1/1999 | Eitan | |
| 5,903,248 A | 5/1999 | Irwin | |
| 6,197,644 B1 | 3/2001 | Gardner et al. | |
| 6,219,270 B1 | 4/2001 | Van Geloven et al. | |
| 6,344,672 B2 | 2/2002 | Huffman | |
| 6,421,285 B2 | 7/2002 | Matsuzaki et al. | |
| 6,431,714 B1 | 8/2002 | Sawada et al. | |
| 6,466,358 B2 | 10/2002 | Tew | |
| 6,483,738 B2 | 11/2002 | Kang et al. | |
| 6,535,187 B1 | 3/2003 | Wood | |
| 6,556,663 B2 | 4/2003 | Danner et al. | |
| 6,841,834 B2 | 1/2005 | Nowak | |
| 7,012,592 B2 * | 3/2006 | Richards | 345/92 |

FOREIGN PATENT DOCUMENTS

JP  55-101185  * 8/1980

* cited by examiner

*Primary Examiner*—Richard Hjerpe
*Assistant Examiner*—Abbas Abdulselam
(74) *Attorney, Agent, or Firm*—W. James Brady, III; Frederick J. Telecky, Jr.

(57) ABSTRACT

A voltage storage cell circuit includes an access transistor and a storage capacitor, wherein the source of said access transistor is connected to a bitline, the gate of said access transistor is connected to a wordline, and wherein the drain of said access transistor is connected to a first plate of said storage capacitor forming a storage node, and wherein the second plate of said storage capacitor is connected to a pump signal. This arrangement allows for a novel pixel circuit design with area requirements comparable to that of a 1T1C DRAM-like pixel cell, but with the advantage of an output voltage swing of the full range allowed by the breakdown voltage of the pass transistor. A spatial light modulator such as a micromirror array can comprise such a voltage storage cell.

20 Claims, 5 Drawing Sheets

SPATIAL LIGHT MODULATOR WITH CHARGE-PUMP PIXEL CELL

CROSS-REFERENCE TO RELATED PATENT APPLICATIONS

This patent application is a continuation of U.S. patent application Ser. No. 10/340,162 filed Jan. 10, 2003, now U.S. Pat. No. 7,012,592 the subject matter of which is incorporated herein by reference in entirety.

TECHNICAL FIELD OF THE INVENTION

This invention relates generally to spatial light modulators used for display systems, and more particularly, to methods and apparatus for applying drive voltages to the pixels of such display systems.

BACKGROUND OF THE INVENTION

The well-known cathode ray tube (CRT) is widely used for television (TV) and computer displays. Other display technologies such as the transmissive liquid crystal display (LCD) panel are widely used in certain specialized applications such as displays for portable computers and video projectors.

Market demand is continuously increasing for video displays with higher resolution, greater brightness, lower power, lighter weight, and more compact size. But, as these requirements become more and more stringent, the limitations of conventional CRTs and LCDs become apparent. Microdisplays the size of a silicon chip offer advantages over conventional technologies in resolution, brightness, power, and size. Such microdisplays are often referred to as spatial light modulators (SLMs) since, in many applications, (for example, video projection) they do not generate light directly but instead produce an image by modulating an incident light source. In projection applications, an SLM modulates a bright light source such as an arc lamp, forming a projected image on a screen. In other applications such as ultraportable or head-mounted displays, an image on the surface of the SLM may in fact be viewed by the user directly or through magnification optics.

CRTs currently dominate the market for desktop monitors and consumer TVs. But large CRTs are very bulky and expensive. LCD panels are much lighter and thinner than CRTs, but are prohibitively expensive to manufacture in sizes competitive with large CRTs. SLM microdisplays enable cost-effective and compact projection displays, reducing the bulk and cost of large computer monitors and TVs.

Transmissive LCD microdisplays are currently the technology of choice for video projection systems. But, one disadvantage of LCDs is that they require a source of polarized light. LCDs are therefore optically inefficient. Without expensive polarization conversion optics, LCDs are limited to less than 50%-efficient use of an unpolarized light source. Unlike LCDs, micromirror-based SLM displays can use unpolarized light. Using unpolarized light allows projection displays using micromirror SLMs to achieve greater brightness than LCD-based projectors with the same light source, or equivalent brightness with a smaller, lower-power, cheaper light source.

The general operation and architecture of SLMs and SLM-based displays is well known in the industry as shown, for example, in U.S. Pat. No. 6,046,840, U.S. Pat. No. 5,835,256, U.S. Pat. No. 5,311,360, U.S. Pat. No. 4,566,935, and U.S. Pat. No. 4,367,924, the disclosures of which are each incorporated herein by reference.

FIG. 1 shows the optical design of a typical micromirror SLM-based projection display system. A light source 20 and associated optical system, comprising optical elements 2a, 2b, and 2c, focus a light beam 6 onto the SLM 4. The pixels of the SLM are individually controllable and an image is formed by modulating the incident light beam 6 as desired at each pixel. Micromirror-based projection displays typically modulate the direction of the incident light. For example, to produce a bright pixel in the projected image, the state of the SLM pixel may be set such that the light from that pixel is directed into the projection lens 8. To produce a dark pixel in the projected image, the state of the SLM pixel is set such that the light is directed away from the projection lens 8. Other technologies, such as reflective and transmissive LCDs, use other modulation techniques such as techniques in which the polarization or intensity of the light is modulated.

Modulated light from each SLM pixel passes through a projection lens 8 and is projected on a viewing screen 10, which shows an image composed of bright and dark pixels corresponding to the image data loaded into the SLM 4.

A "field-sequential color" (FSC) color display may be generated by temporally interleaving separate images in different colors, typically the additive primaries red, green, and blue, though often a white image is added to boost the brightness of the image. This may be accomplished as described in the prior art using a color filter wheel 12 as shown in FIG. 1. As color wheel 12 rotates rapidly, the color of the projected image cycles rapidly between the desired colors. The image on the SLM is synchronized to the wheel such that the different color fields of the full-color image are displayed in sequence. When the color of the light source is varied rapidly enough, the human eye perceives the sequential color fields as a single full-color image. Grayscale in the image can be achieved by pulse width modulation, such as set forth in WO 01/84531 to Richards, incorporated herein by reference.

Other illumination methods may be used to produce a field-sequential color display. For example, in an ultraportable display, colored LEDs could be used for the light source. Instead of using a color wheel, the LEDs may simply be switched on and off as desired.

An additional color technique is to use more than one SLM, typically one per color, and combine their images optically. This solution is bulkier and more expensive than a single-SLM solution, but allows the highest brightness levels for digital cinema and high-end video projection.

In a CRT or conventional LCD panel the brightness of any pixel is an analog value, continuously variable between light and dark. In fast SLMs, for example those based on micromirrors, other MEMS structures, or some types of LCDs, one can operate the pixels in a digital manner. That is, pixels of these devices are driven to one of two states: flly on (bright) or fully off (dark).

To produce the perception of a grayscale or full-color image using such a digital SLM, it is necessary to rapidly modulate the pixels of the display between on and off states such that the average of each pixel's modulated brightness waveform corresponds to the desired 'analog' brightness for that pixel. This technique is generally referred to as pulse-width modulation (PWM). Above a certain modulation frequency, the human eye and brain integrate a pixel's rapidly varying brightness (and color, in a field-sequential color display) and perceive an effective 'analog' brightness (and color) determined by the pixel's average illumination over a video frame.

It is generally advantageous to drive the pixels of a digital SLM with as large a voltage as possible. For example, in a MEMS based microdisplay such as those disclosed in U.S. Pat. Nos. 5,835,256 and 6,046,840 (both to Huibers and incorporated herein by reference) a large actuation voltage increases the available electrostatic force available to move the micromechanical pixel elements. Greater electrostatic forces provide more operating margin for the micromechanical elements—increasing yield—and actuate them more reliably and robustly over variations in processing and environment. Greater electrostatic forces also allow the hinges of the MEMS structures to be made correspondingly stiffer; stiffer hinges may be advantageous since the material films used to fabricate them may be made thicker and therefore less sensitive to process variability, improving yield. A further benefit of larger electrostatic forces and stiffer micromechanical hinges is that more force is available to overcome the stiction force that is present between contacting MEMS structures. The pixel switching speed may also be improved by raising the drive voltage to the pixel, allowing higher frame rates, or greater color bit depth to be achieved.

Higher actuation voltages may be of benefit for other SLM types, as well. For example, many LCD materials can be made to switch states faster with a larger drive voltage, allowing greater frame rates and/or color bit depth.

Designing high-voltage circuitry to individually control the pixels of an SLM is challenging. Due to fundamental principles of semiconductor physics, transistors that tolerate higher voltages must be physically larger than those that tolerate lower voltage. Larger, HV-tolerant transistors may unacceptably reduce the cell area available for other critical cell components (such as the capacitor in a DRAM-type cell) or not fit in the cell at all. On the other hand, it is desirable for cost reasons to minimize the physical size of the microdisplay pixel. Thus it is highly desirable to improve the maximum drive voltage of an SLM pixel circuit while maintaining small pixel size.

The 1-transistor, 1-capacitor (1T1C) DRAM charge-storage cell illustrated in FIG. 2 is a well-known circuit for storing a data voltage in many applications. The 1T1C circuit is widely applied to ordinary data storage in commercial DRAMs and other integrated-circuit applications. This 1T1C circuit structure is also used in display applications—TFT active-matrix LCD panels work on the same principle, and the idea has also been applied to microdisplays as described in U.S. Pat. No. 5,671,083.

A well-known drawback of the 1T1C DRAM circuit is the nonideal performance of the pass transistor. Ideally the transistor would act as a perfect switch; the voltage on the bitline 101 would be passed through without change to the storage node 102 when the wordline 100 is activated. A real NMOS pass transistor can pull the stored cell voltage 102 down all the way to the minimum bitline 101 voltage $V_{bmin}$. However the highest voltage that can be driven on the cell storage node 102 is limited by the threshold voltage of the pass transistor 104. The transistor can only pull the voltage Vc on cell storage node 102 up to no higher than Vg-Vt, where Vg is the wordline 'on' voltage applied to the gate of the pass transistor, and Vt is the transistor's threshold voltage. To maximize Vc, Vg would typically be driven to Vdd, the maximum supply voltage allowed by the breakdown limits of the IC process in which the circuit is fabricated. In this case the resulting cell voltage will be Vdd-Vt, whereas the bitline voltage is driven to Vdd. So the transistors of the cell are themselves capable of tolerating Vc=Vdd, but the maximum actual Vc is limited to only Vdd-Vt due to the inherent properties of the 1T1C cell circuit.

Compounding the problem is the well-known MOSFET 'body effect.' This causes the effective Vt of the pass transistor to become even larger as the transistor's source node (the storage node 102) rises in voltage, as is the case when the cell is charged to Vdd-Vt. This reduces the maximum available output Vc still further.

One of ordinary skill in the art of circuit design will appreciate that the above discussion applies equally well to a PMOS transistor, which will suffer similar voltage degradation when pulling the stored voltage down.

Clearly, a circuit that could store the full supply voltage of Vdd on Vc would be more desirable. Many candidate circuit designs are impractical in a microdisplay due to the small pixel cell size. For example, a 2-transistor (PMOS+ NMOS) pass gate could be used to get the full supply voltage swing on the storage node. However, the large design rules required for adequate spacing between PMOS and NMOS devices and their associated wells are impractical for small pixel sizes. Alternatively, an SRAM pixel cell could be used, but this cell requires 6 transistors that also would likely not fit in the available pixel area. Alternatively a PMOS transistor or diode could be added to the cell to 'precharge' the pixel cell high before writing it to a low value, but high-voltage PMOS devices or diodes also occupy an unacceptably large amount of area for small microdisplay pixels due to their associated well implants. A further alternative would be to increase the gate voltage to the wordline by $V_t$ over the maximum cell voltage. However, this would require even higher-voltage transistors than the high-voltage transistor in the cell. Fabricating two types of high voltage (HV) transistors would increase cost and the cell would still not be able to use the highest-voltage transistors available.

SUMMARY OF THE INVENTION

The present invention describes a novel pixel circuit design with area requirements comparable to that of a 1T1C DRAM-like pixel cell, but with the advantage of an output voltage swing of the full range allowed by the breakdown voltage of the pass transistor.

According to one aspect of the present invention, the second plate of the cell's storage capacitor is connected to a 'pump' signal which allows the stored cell voltage to be boosted during the cell write cycle.

According to a further aspect of the present invention, the cell's bitlines and wordlines are controlled during the write cycle to avoid forward-biasing the access transistor's drain junction while the cell voltage is boosted during the write cycle.

According to a further aspect of the present invention, the pass transistor type (NMOS vs. PMOS) and the voltage levels of the wordline, bitline, and 'pump' signal are selected to minimize leakage, light sensitivity, and other undesirable parasitic effects of using high voltages.

According to a further aspect of the present invention, a high voltage may be obtained on the pixel electrode while using only low voltages on the pixel array's bitlines and wordlines; high voltage drivers are only required on the 'pump' signal for each row of the array.

According to a further aspect of the present invention, an asymmetrical (low-voltage source and gate) high-voltage MOS transistor may be used in the cell, reducing the cell area required by the cell's transistor.

According to a further aspect of the present invention, standard logic voltage levels of 5 volts or less (e.g. 3.3 or 5 volts) may be used on the bitline and wordline of a pixel cell, but by providing a pump signal, a total pixel voltage swing of at least 5 volts may be obtained.

DESCRIPTION OF THE EMBODIMENTS

Figure 1:
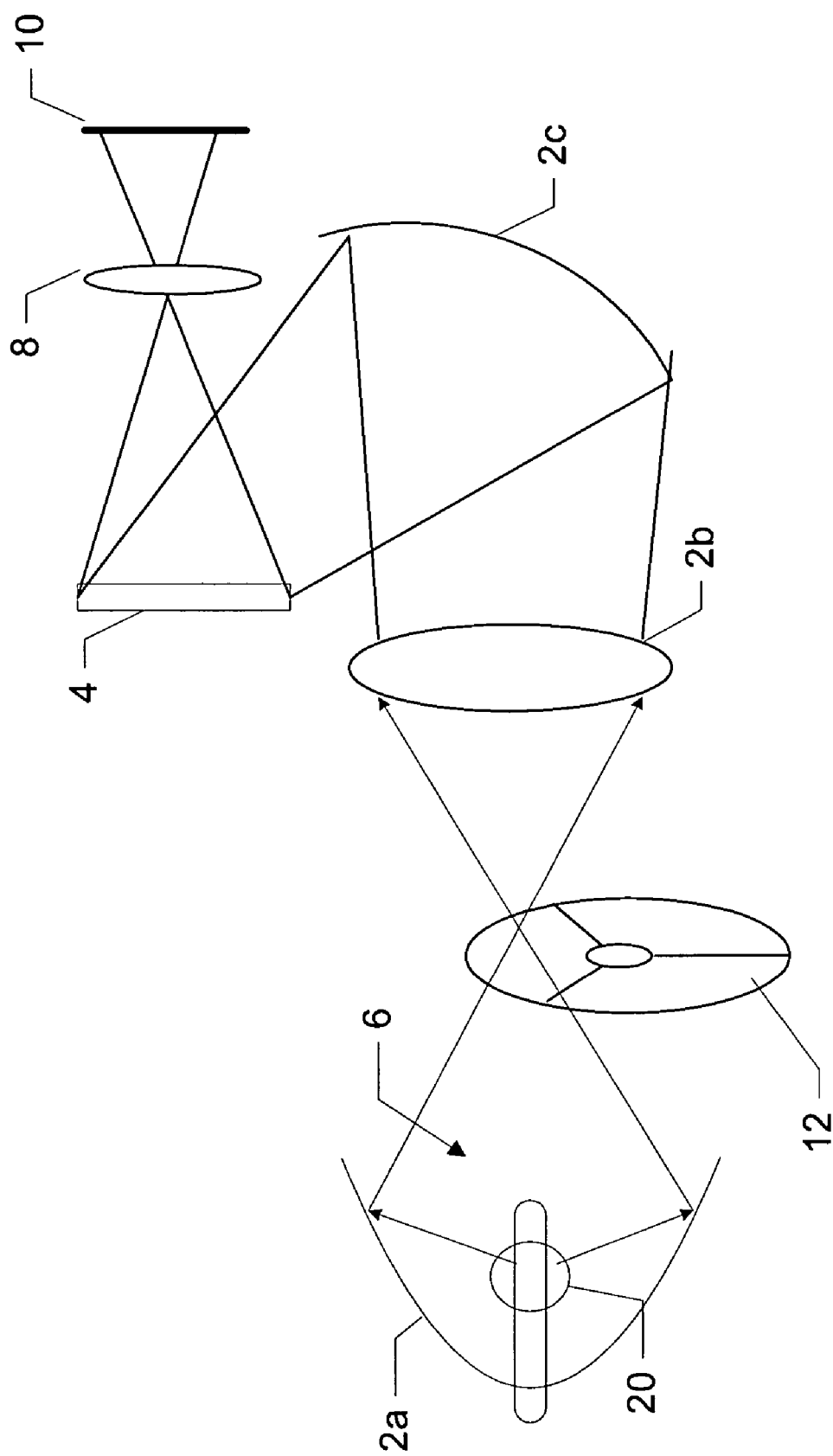
FIG. 1 illustrates a typical SLM-based projection display system.
Figure 2:
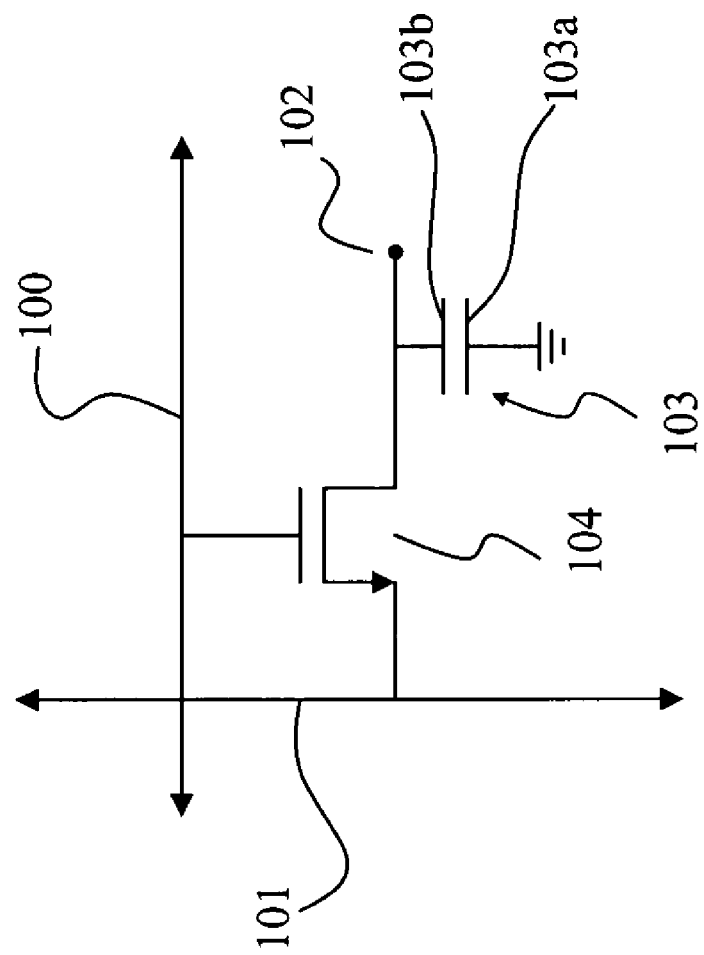
FIG. 2 illustrates a 1T1C DRAM circuit as is well-known in the prior art.
Figure 3:
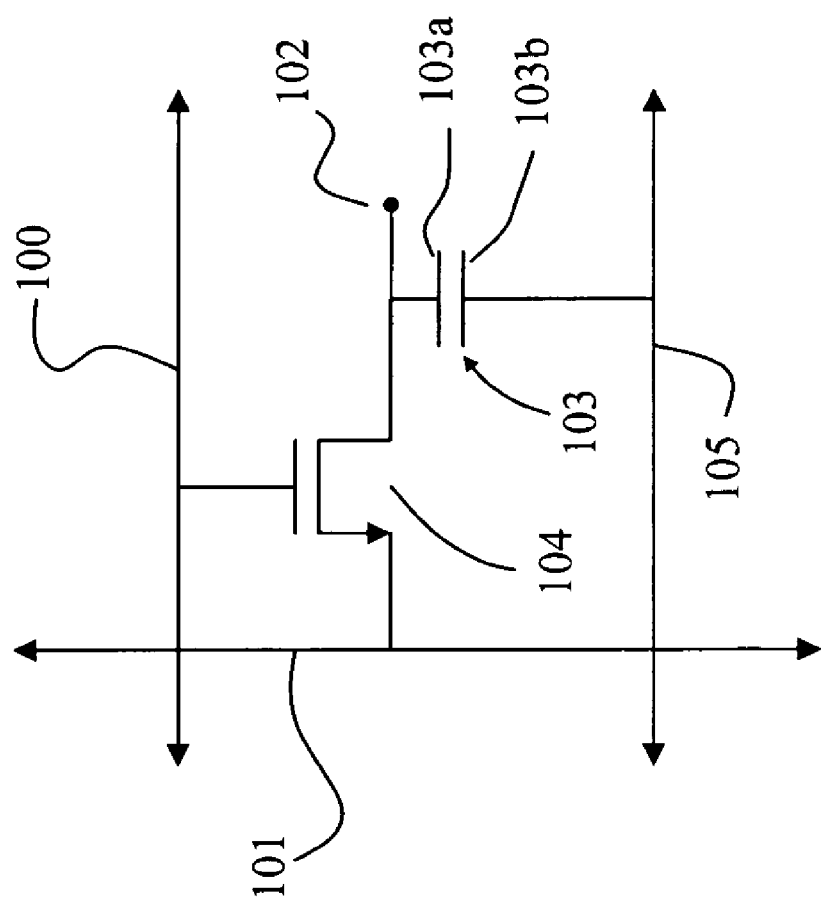
FIG. 3 illustrates a pixel circuit diagram according to an embodiment of the invention.

FIG. 2 is an illustration of a prior art DRAM cell circuit, whereas FIG. 3 is an illustration of a cell circuit of the present invention. As can be seen in both figures, each pixel contains a pass transistor 104 and a storage capacitor 103, as well as a wordline signal 100 for enabling access to a row of cells and a bitline signal 101 for reading and writing data to a column of cells. The cell's state is stored as a high or low voltage on the storage node 102. In a conventional DRAM illustrated in FIG. 2, first plate 103a of the storage capacitor is connected to the drain of the pass transistor. And the second plate node of the storage capacitor 103 is connected to a fixed supply voltage such as Vdd, Ground, or some intermediate supply voltage such as Vdd/2 as is shown in FIG. 2. In the present invention illustrated in FIG. 3, the second capacitor plates of pixels in each row are connected to a 'pump' signal 105.

Figure 4:
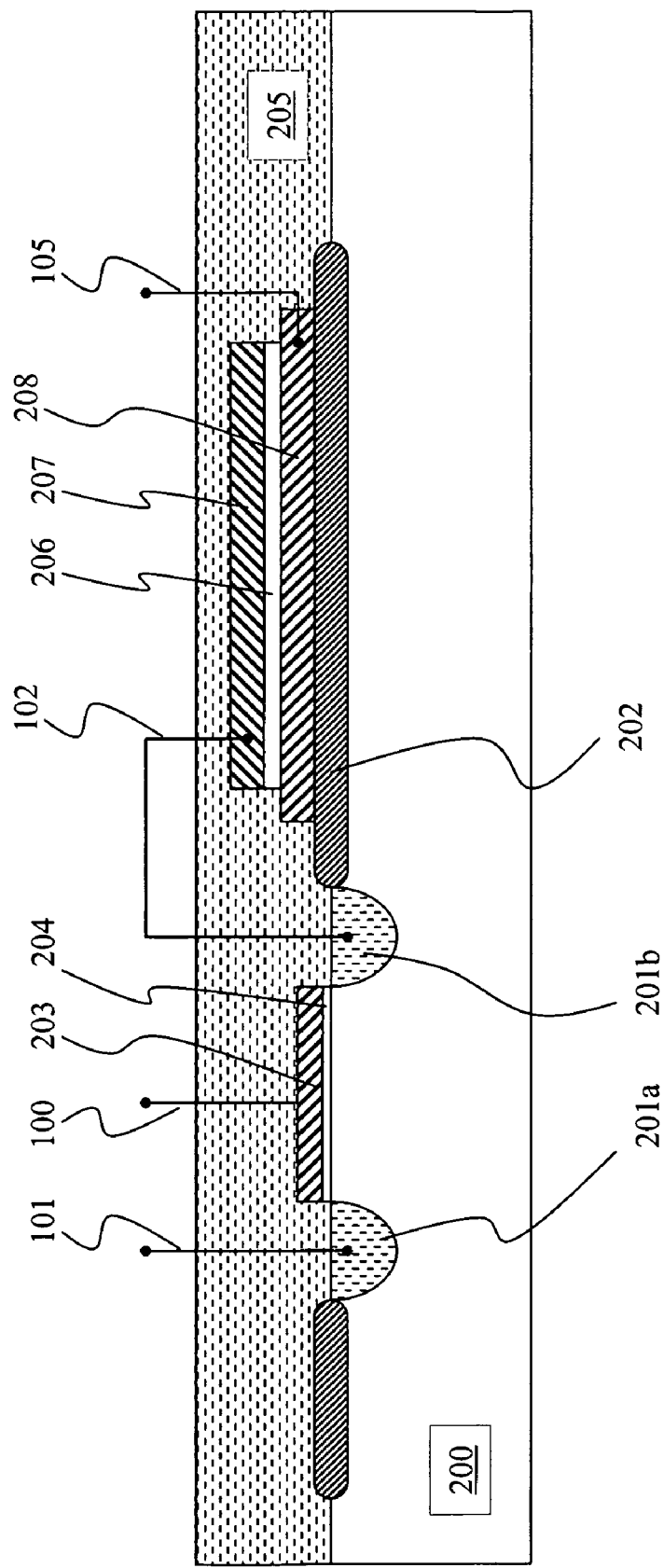
FIG. 4 is a simplified cross-sectional view of a pass transistor and capacitor of the pixel circuit of FIG. 3.

A simplified cross section of the circuit as implemented in a typical 2-poly CMOS process is shown in FIG. 4. Of course, the following is exemplary only and many other designs are possible. Metal interconnect and contacts to the source/drain diffusions and polysilicon gates are not shown for clarity. The methods for fabricating this structure are readily commercially available and well-known. The circuit is fabricated on a p-type silicon substrate 200. Gate oxide 204 and field oxide 202 are then formed, and N+ (heavy doping) diffusions 201a, 201b are created to form the source and drain of the pass transistor 104. The diffusions 201a, 201b may be simple diffusions or any other source-drain structure well-known to those skilled in the art. For example, double-diffused-drain ("DDD") or lightly-doped drain ("LDD") type diffusions may be advantageous for high-voltage operation. Polysilicon is then deposited and patterned to form the transistor gate 203 on top of the thin gate oxide 204, and the bottom plate 208 of the storage capacitor 103. Subsequently the capacitor dielectric 206 is deposited and then the top polysilicon plate 207 is deposited and patterned. Alternatively the bottom plate 208 may be formed first, and the gate 203 and top plate 207 may subsequently deposited and patterned.

Using metal interconnect and vias (not shown), the polysilicon gate 203 is connected to the wordline signal 100. The source diffusion 201a is connected to the bitline signal 101. The drain diffusion 201b is preferably connected to the top plate of the capacitor 207 and the 'pump' signal 105 is connected to the other plate of the capacitor 208. Alternatively the drain diffusion 201b may be connected to the bottom capacitor plate 208 and the pump signal 105 to the top plate 207. The connection of the transistor drain 201b and capacitor plate 207 forms the cell's charge-storage node 102.

In typical 2-poly processes, design rules often do not allow the top poly 207 to overlap the edge of the bottom poly 208, often for step-coverage reasons. Since the 'pump' signal 105 is common to a row of pixels, it is preferable to connect the pump signal to the bottom poly and connect the pump signal 105 of neighboring cells by abutting the bottom poly 208. The pump signal 105 could be connected to the top poly 207, but in this case since top poly cannot cross over the bottom-poly 208 boundaries between neighboring cells, the available capacitor area would be reduced by gap required between the poly layers of neighboring cells. For this reason it is preferable to connect the pump signal to the bottom plate 208.

By driving the 'pump' signal 105 in conjunction with the bitline 101 and wordline 100 as described in this invention, it is possible to store a voltage range larger than Vdd-Vt on the storage node 102.

According to one embodiment of the invention, the pass transistor 104 is an NMOS transistor. Bitline 101 and wordline 100 take on logic levels of logic '0'=0V and logic '1'=$V_1$, where $V_1$>0. Pump signal 105 takes on logic levels of logic '0'=$V_{PL}$ and logic '1'=$V_{PH}$, where $V_{PH}$>$V_{PL}$.

Figure 5:
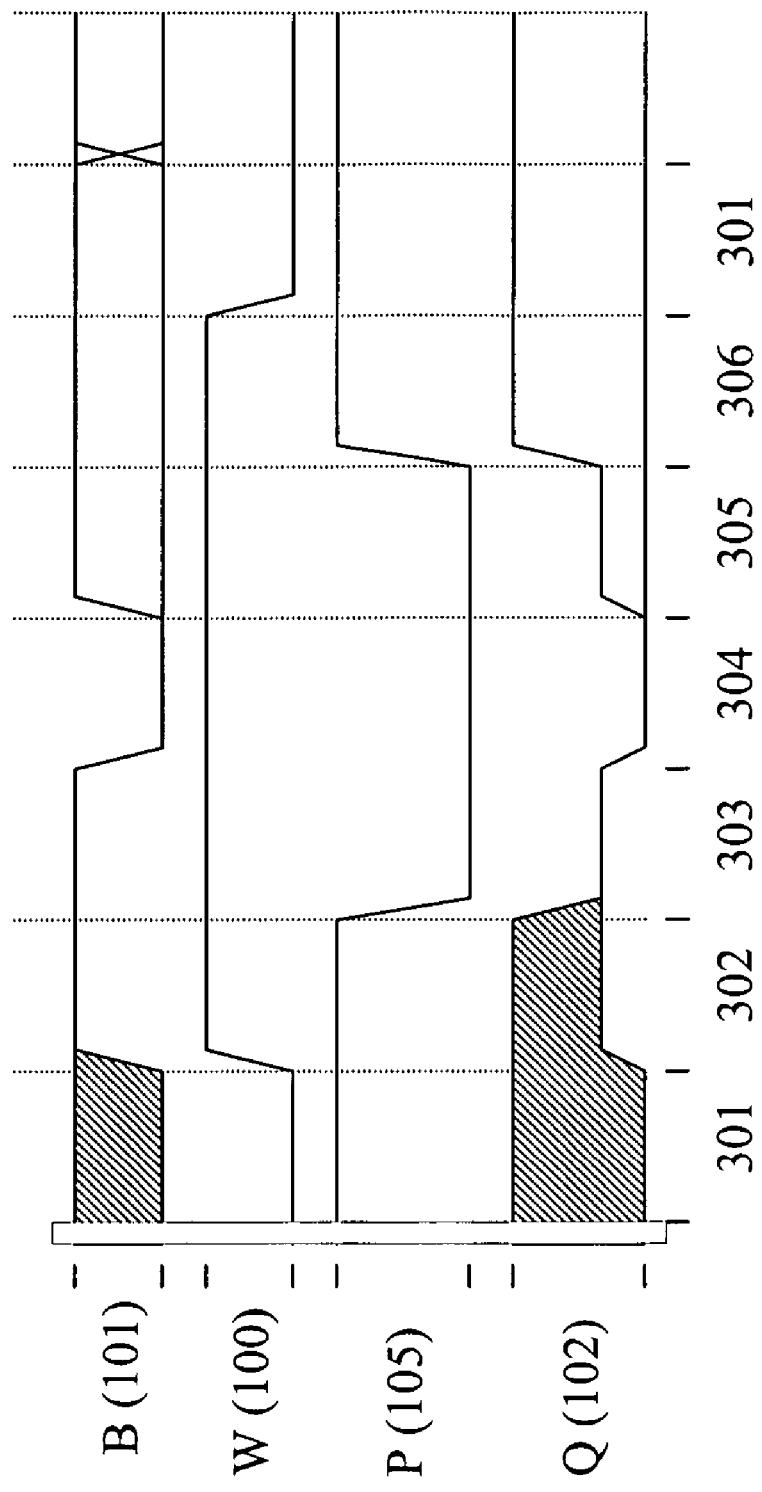
FIG. 5 is a diagram showing exemplary voltage waveforms applied to the pixel circuit of FIG. 3.

The voltage waveforms applied to the pixel are illustrated in FIG. 5. In the cell's 'hold' state 301, the cell stores a value as a high or low voltage on the storage node 102. The cell's control signals (collectively the wordline, bitline, and pump signal) are set as follows in the 'hold' state. The wordline 100 is held low, turning off the pass transistor 104. The pump signal 105 is held in a high state. The bitline 101 may be in either a high or low state; the bitline state does not matter since the pass transistor 104 is off. In this state the bitlines and other rows' wordlines and pump signals may be driven as necessary to access other rows of cells while the illustrated row remains stable in its 'hold' state.

In order to prepare the cell to be written, the 'pump' signal voltage must be brought low. However, if the voltage on the storage node 102 is already low, care must be taken so that the storage node voltage 102 is not driven below the potential of the substrate 200 (usually GND) when the pump signal 105 falls. For example, suppose the stored voltage Vq on the storage node 102 is 0 and the wordline is maintained in the low state while the pump signal 105 is driven low. Since the pass transistor is off, coupling through the capacitor will drive the storage node 102 voltage down as the pump signal 105 falls—until the storage node 102 goes a diode-drop below ground, forward-biasing the PN junction between the device's drain 201b and the substrate 200. This is highly undesirable as it would inject minority carrier current into the substrate, likely causing problems with latchup, noise, and/or leakage in nearby circuits.

One approach to mitigating the substrate-current problem is to set the bitline 101 low and the wordline 101 high while the pump signal 105 is brought low, effectively connecting the storage node to ground through the turned-on 'switch' formed by the pass transistor. If the pass transistor 104 acted as an ideal switch this would then prevent the storage node 102 from being driven below ground. However, the finite on-resistance of the pass transistor, bitline, and bitline driver will still allow some excursion below GND as the pump signal falls. While the pass transistor drain junction may not be fully forward-biased in this case, the situation is still marginal and a more robust solution is desirable.

A preferred solution to the substrate-current problem is to drive the bitline and wordline high before the pump signal is brought low. This limits the minimum voltage excursion on the storage node 102 to be Vdd-Vt, well above ground and positively safe from any undesired substrate-injection effects. Thus, in preparation for a write cycle to the pixel cell, it is preferable that the bitline, wordline and pump signal are first set to a 'pre-discharge' state 302 in which the bitline, wordline, and pump signal are all high. If the pixel originally was storing a low voltage, its voltage is pulled up to Vdd-Vt. If the pixel was originally storing a high voltage, the stored voltage is unaffected.

Subsequently, in the 'discharge' state 303, the pump signal is set low. If the pixel originally stored a high voltage, the stored voltage is brought down to Vdd-Vt. If the pixel originally stored a low voltage, the stored voltage is clamped to Vdd-Vt as the pump signal falls.

Due to second-order effects such as leakage and capacitive charge-sharing, the final voltage after the 'discharge' state may depend slightly on the original pixel state. To guarantee that the previous pixel state is fully cleared, the control signals may optionally be set to the 'clear' state 304 in which the bitline is set low, the wordline is high, and the pump signal is low, thereby forcing the stored voltage to zero volts.

After the 'discharge' state 303 and the optional 'clear' state 304, the cell is ready to be written with a new stored value. The control signals are set to the 'write' state 305 in which the bitline of the pixel is set high or low depending on the desired final pixel value, the wordline is high, and the pump signal is low. The stored pixel voltage will go to 0 or Vdd-Vt depending on whether the bitline is low or high. Subsequently, the control signals are set to the 'charge' state 306 in which the pump signal is set high, and the bitline and wordlines retain their previous states from the 'write' state. If the bitline is low, the pass transistor will be on and the pixel's stored voltage will be clamped at zero volts as the pump signal rises. However, if the bitline is high, the transistor will be off and the stored voltage will be driven above the bitline and wordline voltage by the rising edge of the pump signal coupling through the storage capacitor.

Finally, the wordline is brought low, returning the control signals to the 'hold' state 301 and completing the write cycle. The desired high or low voltage has been stored in the cell.

Ideally, in the 'charge' state, the pumpline's upward step of Vph-Vpl volts would result in an upward step on the cell voltage of Vph-Vpl volts from the initial value of Vdd-Vt, for a final voltage of Vdd-Vt+Vph-Vpl. For example, if Vpl is 0 and Vph is the maximum rated voltage of the process, then the maximum final pixel voltage is approximately Vdd-Vt+Vmax, which would be greater than the maximum allowed voltage. The chosen value for Vdd and/or Vph-Vpl can be reduced as necessary to keep the maximum cell voltage within acceptable limits while providing substantial margin below the maximum rated supply voltages.

Nonideal effects such as charge-sharing reduce the size of upward 'step' on the stored pixel voltage during the 'charge' state from Vph-Vpl to K(Vph-Vpl), where K is slightly less than 1. By increasing Vdd or Vph-Vpl slightly this effect may typically be overcome; in typical cases the required increase is still within the maximum rated supply voltages for Vph and Vpl.

An additional advantage of this invention is that the source node 201a and gate 203 of the pass transistor do not need to support the full output voltage swing. This enables an asymmetrical high-voltage transistor to be used where only the drain is HV-tolerant, resulting in a more compact layout. Also a thinner gate oxide can be used since the wordline voltage is low, improving the drive characteristics of the pass transistor. Additionally, the circuitry that drives the bitlines and wordlines is simplified due to the reduced voltage swing, high-voltage level shifters and drivers are only required on the pump signals. The reduced voltage swing on the bitlines also greatly reduces the power consumption of the device.

An equivalent circuit could equally well be implemented using a PMOS pass transistor in an n-type substrate or well, with the appropriate change in polarity of voltage levels the control signals as shown in Table 1.

TABLE 1

| Transistor type | Wordline 'active' | Wordline 'inactive' | Bitline 'active' | Bitline 'inactive' | Pumpline 'active' | Pumpline 'inactive' |
|---|---|---|---|---|---|---|
| NMOS | high | Low | High | Low | high | low |
| PMOS | low | High | Low | High | low | high |

A potential problem with this circuit exists due to the 'field threshold' of the bottom capacitor plate over the field oxide and substrate. When large voltages are applied to this bottom plate, the surface of the substrate may be inverted, producing an undesired parasitic FET. The minority carriers and depletion region associated with this parasitic FET may interact unfavorably with the cell's pass transistor, and it is desired to avoid this effect.

A solution to this problem might be (in the case of an NMOS pass transistor in a p-substrate) to offset the levels of the pump signal. For example, Vpl=−10V and Vph=+10V could be used equally well instead of Vpl=0V and Vph=+20V. However, in the case of a conventional p-substrate, n-well process, the negative voltage of Vpl presents practical difficulties, as NMOS device cannot be fabricated to drive the pump signal below ground.

A preferred alternative is to use a PMOS pass transistor, fabricated in an n-well biased to Vdd, where Vdd is the maximum positive voltage on the bitline and wordline. In this case we can choose Vpl=0V and Vph=+20V, driving the pump signal low with an NMOS device fabricated in the substrate and high with a PMOS device fabricated in an electrically separate n-well biased to Vph.

This design will result in the stored pixel voltage being driven below ground—however this is acceptable as the voltage is only present on the p+ diffusion of the pass transistor within an n-well.

An advantage of fabricating the pass transistor in a well with a bias voltage between Vph and Vpl is that the pump voltage creates less-harmful accumulation in the substrate surface instead of inversion. In the case of a p-substrate process, this would require choosing a PMOS device and an n-well bias below the maximum pump signal voltage Vph. One skilled in the art will appreciate that a similar but complementary circuit provides this advantage if substrate is n-type; then an NMOS device should be used in a p-well with bias voltage above the minimum pump signal voltage.

A further advantage of fabricating the pass transistors in a well (as opposed to the substrate) is that light-induced leakage current is reduced. While some incident photons from the projection system's light source will create hole-electron pairs in the well, contributing to cell leakage, a significant fraction of the incident photons from the projection system's light source will pass through the well and generate hole-electron pairs in the substrate, creating harmless leakage between the well and substrate.

An advantage of using a PMOS pass transistor is that, at high bias voltages, it exhibits reduced impact ionization compared to an NMOS transistor, which in an NMOS transistor can result in multiplication of the leakage current and increased leakage compared to a PMOS device.

A further advantage of this well-biasing scheme is that the maximum absolute value of the voltage across the storage capacitor is reduced, enabling a thinner oxide to be used for greater capacitance and more reliable operation.

A still further advantage of the circuit of the present invention is that the pass transistor of the circuit can function as an asymmetric high-voltage transistor. Specifically, the absolute value of the drain voltage can be greater than that of the source. Moreover, the absolute value of the difference between the maximum voltage and the minimum voltage of the drain can also be greater than that of the source.

A still further advantage of the circuit provided by the present invention is that the asymmetric high-voltage pass transistor allows more area for the capacitor. Moreover, the asymmetric high-voltage transistor enables the storage capacitor to maintain a high voltage. For example, the capacitor can maintain a voltage at least 10 volts, 15 volts or 20 volts.

A further advantage of the circuit provided by the present invention is that a standard logic voltage level of 5 volts or less (e.g. 3.3 or 5 volts) may be used on the bitline and wordline of a pixel cell. However, by providing a pump signal, a total pixel voltage swing of at least 5 volts may be obtained. Voltage swings of 10 volts or more (or even 20 volts or more) can be achieved in the present invention.

The circuit as discussed above has varieties of applications. For example, the circuit can be used in a spatial light modulator. In this application, the storage node (e.g. 102 in FIG. 3) can be used to control optical states of a pixel in the spatial light modulator, wherein the pixel can be a liquid crystal pixel cell.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. In particular, the storage capacitor (103 in FIG. 3) can be any type of capacitors, such as a typical MOS-type capacitor (a MOS-type capacitor is a MOS-type transistor with the gate functions as a first plate, and the source and drain connected together for forming a second plate). Therefore, the scope of the appended claims should be accorded the broadest interpretation so as to encompass all such modifications and similar arrangements.

I claim:

1. A method, comprising:
for a memory cell comprising a transistor and a capacitor, wherein the drain of the transistor is connected to a first plate of the capacitor forming a voltage node,
connecting the source to a bitline, the gate to a wordline, and a second plate of the capacitor to a pump line; and
actuating the memory cell, comprising:
driving a first voltage signal through the wordline;
driving a second voltage signal through the wordline; and
wherein the first and second signals are independent of each other.

2. The method of claim 1, comprising:
setting the second plate of the capacitor through the pump line to a high or low voltage state independent form a voltage state of the gate and a voltage state of the wordline.

3. The method of claim 1, comprising:
setting the gate to a high or low voltage state through the wordline independent from a voltage state of the second plate of the capacitor.

4. The method of claim 1, wherein the first voltage signal is a "low voltage state", wherein the second voltage signal is a "high voltage signal"; and wherein the voltage node remains the same voltage status as the bitline.

5. The method of claim 1, wherein the first and second voltage signals are "high voltage states"; and wherein the voltage node is at a "high voltage state" if the bitline is at a "high voltage state"; and wherein the voltage node is at an "intermediate voltage state" between the "high voltage state" and "low voltage state" if the bitline is at a "low voltage state".

6. The method of claim 1, wherein the first voltage signal is a "high voltage state", wherein the second voltage signal is a "low voltage signal"; and wherein the voltage node is set to an "intermediate voltage state" between the "high voltage state" and "low voltage state" if the bitline is at a "high voltage state".

7. The method of claim 1, further comprising:
connecting the voltage node to an electrode such that the electrode can be at the same voltage as the voltage node.

8. The method of claim 7, wherein the electrode is associated with a reflective and deflectable mirror plate such that an electrostatic field is capable of being established between the electrode and mirror plate.

9. The method of claim 8, wherein the mirror plate is a member of a micromirror device.

10. The method of claim 9, comprising:
switching the mirror plate of the micromirror between an ON and OFF state by adjusting the electrostatic field between the mirror plate and electrode through the wordline, bitline, and pump line.

11. The method of claim 10, wherein the memory cell is a member of an array of memory cells each of which is associated with one of mirror plates of an array of micromirror devices.

12. The method of claim 11, wherein the micromirror devices of the array are members of a spatial light modulator of a projection system.

13. The method of claim 1, wherein the memory cell is a member of an array of memory cells.

14. The method of claim 1, wherein said storage node controls an optical state of a pixel in a spatial light modulator.

15. The method of claim 14, wherein said pixel is a liquid-crystal pixel cell.

16. The method of claim 1, wherein the transistor and capacitor are formed on a poly-silicon.

17. The method of claim 1, wherein both plates of the capacitor are formed on a semiconductor substrate by a film deposition technique.

18. The method of claim 17, wherein the transistor is a P-MOS.

19. The method of claim 17, wherein the transistor is a N-MOS.

20. The method of claim 17, wherein the first and second plates are separated by a dielectric layer disposed therebetween.

* * * * *